United States Patent
Tachibana

(10) Patent No.: US 8,400,821 B2
(45) Date of Patent: Mar. 19, 2013

(54) SEMICONDUCTOR STORAGE DEVICE

(75) Inventor: Fumihiko Tachibana, Koganei (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/239,266

(22) Filed: Sep. 21, 2011

(65) Prior Publication Data

US 2012/0127784 A1    May 24, 2012

(30) Foreign Application Priority Data

Nov. 22, 2010 (JP) ................................. 2010-259893

(51) Int. Cl.
- G11C 11/00 (2006.01)
- G11C 5/06 (2006.01)
- G11C 7/02 (2006.01)

(52) U.S. Cl. ........ 365/156; 365/63; 365/207; 365/210.1
(58) Field of Classification Search .................. 365/154, 365/155, 156, 210.1, 63, 207
See application file for complete search history.

(56) References Cited

U.S. PATENT DOCUMENTS

| | | | |
|---|---|---|---|
| 7,277,322 B2 | 10/2007 | Hirabayashi | |
| 2009/0073760 A1* | 3/2009 | Betser et al. | 365/185.2 |
| 2011/0026348 A1* | 2/2011 | Narui | 365/210.1 |

FOREIGN PATENT DOCUMENTS

| | | |
|---|---|---|
| JP | 2006004476 A | 1/2006 |
| JP | 2008052906 A | 3/2008 |
| JP | 2009266329 A | 11/2009 |

OTHER PUBLICATIONS

Amrutur et al., "A Replica Technique for Worldline and Sense Control in Low-Power SRAM's," IEEE Journal of Solid-State Circuits, Aug. 1998, pp. 1208-1219, vol. 33, No. 8.

* cited by examiner

Primary Examiner — Ly D Pham
(74) Attorney, Agent, or Firm — Knobbe, Martens, Olson & Bear LLP

(57) ABSTRACT

According to one embodiment, a dummy cell simulates an operation of a memory cell. A main dummy bit line transmits a signal read out from the dummy cell. An inverter makes a sense amplifier circuit to operate based on a potential of the main dummy bit line. n (n is a positive integer) number of auxiliary dummy bit lines are provided. A switching element connects at least one of the n number of auxiliary dummy bit lines to the main dummy bit line.

20 Claims, 3 Drawing Sheets

SEMICONDUCTOR STORAGE DEVICE

CROSS-REFERENCE TO RELATED APPLICATIONS

This application is based upon and claims the benefit of priority from Japanese Patent Application No. 2010-259893, filed on Nov. 22, 2010; the entire contents of which are incorporated herein by reference.

FIELD

Embodiments described herein relate generally to a semiconductor storage device.

BACKGROUND

In semiconductor storage devices, at the time of reading of data from a memory cell, in order to correct an operation timing of a sense amplifier according to variation of a cell current due to variation of process conditions and operating conditions, there is a method in which the cell current flowing in a memory cell is simulated by a replica cell and the operation timing of the sense amplifier is controlled based on a monitor result of the cell current simulated in the replica cell.

On the other hand, the cell current varies in each memory cell, so that, in order to prevent occurrence of a read failure even in a memory cell whose cell current is the lowest, a margin of the operation timing of the sense amplifier is set according to the width of the distribution of the cell current.

The margin needed at this time varies depending on the process conditions and the operating conditions. Therefore, when the margin is set corresponding to the worst process conditions or the worst operating conditions, the margin becomes excessive in the best process conditions or the best operating conditions, which causes deterioration in access time.

DETAILED DESCRIPTION

In general, according to a semiconductor storage device of embodiments, a memory cell, a bit line, a sense amplifier circuit, a dummy cell, a main dummy bit line, an inverter, auxiliary dummy bit lines, and a switching element are provided. The memory cell stores therein data. The bit line transmits a signal read out from the memory cell. The sense amplifier circuit detects data stored in the memory cell based on a signal transmitted through the bit line. The dummy cell simulates an operation of the memory cell. The main dummy bit line transmits a signal read out from the dummy cell. The inverter makes the sense amplifier circuit to operate based on a potential of the main dummy bit line. n (n is a positive integer) number of auxiliary dummy bit lines are provided. The switching element connects at least one of the n number of auxiliary dummy bit lines to the main dummy bit line.

Exemplary embodiments of a semiconductor storage device will be explained below in detail with reference to the accompanying drawings. The present invention is not limited to the following embodiments.

First Embodiment

Figure 1:
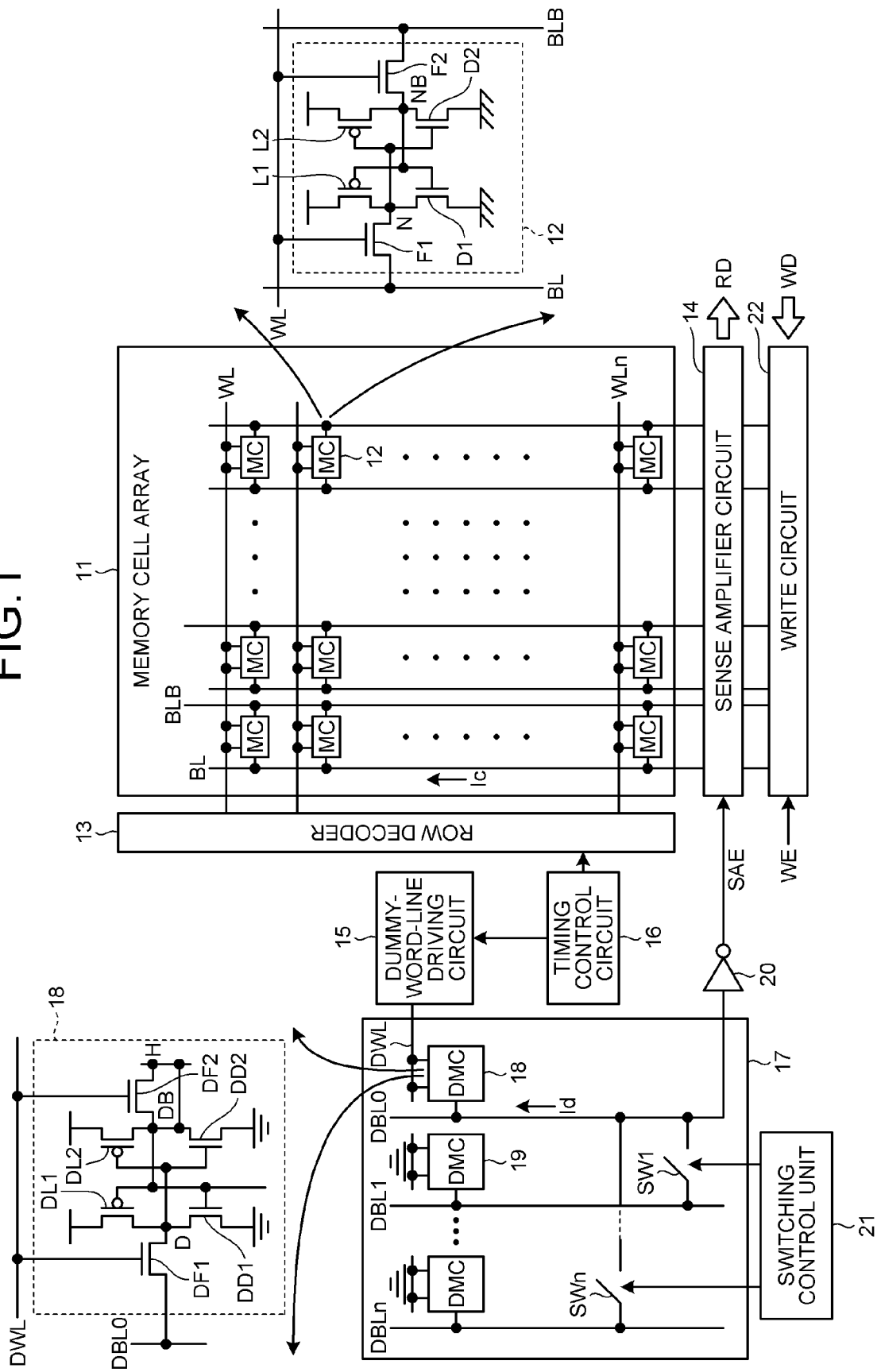
FIG. 1 is a block diagram illustrating a schematic configuration of a semiconductor storage device according to a first embodiment.

FIG. 1 is a block diagram illustrating a schematic configuration of a semiconductor storage device according to the first embodiment.

In FIG. 1, the semiconductor storage device includes a memory cell array 11, a row decoder 13, a sense amplifier circuit 14, a dummy-word-line driving circuit 15, a timing control circuit 16, a dummy cell array 17, an inverter 20, a switching control unit 21, and a write circuit 22.

In the memory cell array 11, memory cells 12 are arranged in a matrix manner in a row direction and a column direction. The memory cells 12 can each complementarily store therein data and can configure, for example, an SRAM.

In the memory cell array 11, word lines WL that transmit a signal that performs row selection of the memory cells 12 are provided. Moreover, in the memory cell array 11, bit lines BL and BLB that transmit data exchanged between the memory cells 12 are provided.

The memory cells 12 in the same row are connected in common via a corresponding word line WL. The memory cells 12 in the same column are connected in common via corresponding bit lines BL and BLB. At the time of reading and writing for the memory cell 12, the bit lines BL and BLB can be complementarily driven. For example, at the time of reading and writing for the memory cell 12, when the bit line BL is set to a high level, the bit line BLB can be set to a low level, and when the bit line BL is set to a low level, the bit line BLB can be set to a high level. The bit lines BL and BLB are both precharged to a high level at the time of standby.

The memory cell 12 includes a pair of drive transistors D1 and D2, a pair of load transistors L1 and L2, and a pair of transfer transistors F1 and F2. P-channel field-effect transistors can be used as the load transistors L1 and L2, and N-channel field-effect transistors can be used as the drive transistors D1 and D2 and the transfer transistors F1 and F2.

The drive transistor D1 and the load transistor L1 are connected in series with each other to form a CMOS inverter and the drive transistor D2 and the load transistor L2 are connected in series with each other to form a CMOS inverter. The outputs and the inputs of a pair of the CMOS inverters are cross-coupled to each other to form a flip-flop. The word line WL is connected to the gates of the transfer transistors F1 and F2.

The connection point of the drain of the drive transistor D1 and the drain of the load transistor L1 can form a storage node N and the connection point of the drain of the drive transistor D2 and the drain of the load transistor L2 can form a storage node NB.

The bit line BL is connected to the storage node N via the transfer transistor F1. The bit line BLB is connected to the storage node NB via the transfer transistor F2.

The row decoder 13 can perform row selection of the memory cells 12 specified by a row address. The sense amplifier circuit 14 can detect data stored in the memory cell 12 based on a signal read out to the bit lines BL and BLB from the memory cell 12. The write circuit 22 can write data WD in the memory cell 12 based on a write enable signal WE.

In the dummy cell array 17, a main dummy cell 18 and n (n is a positive integer) number of auxiliary dummy cells 19 are arranged. The main dummy cell 18 and the auxiliary dummy cells 19 can simulate the operation of the memory cell 12 and can be configured in the similar manner to the memory cell 12. The main dummy cell 18 and the auxiliary dummy cell 19 do not necessarily have the same configuration and, for example, the auxiliary dummy cell 19 can be configured such that the word line WL of the memory cell array 11 is fixed to an L level.

Moreover, the dummy cell array 17 includes a dummy word line DWL that transmits a signal that performs selection of the main dummy cell 18, a main dummy bit line DBL0 that transmits a signal read out from the main dummy cell 18, n number of auxiliary dummy bit lines DBL1 to DBLn that simulate capacitance of the bit lines BL, and switching elements SW1 to SWn that connect the auxiliary dummy bit lines DBL1 to DBLn to the main dummy bit line DBL0, respectively. As the switching elements SW1 to SWn, it is applicable to use a transfer gate in which a P-channel field-effect transistor and an N-channel field-effect transistor are connected parallel to each other or a P-channel field-effect transistor alone.

Each of the main dummy cell 18 and the auxiliary dummy cells 19 includes a pair of dummy drive transistors DD1 and DD2, a pair of dummy load transistors DL1 and DL2, and a pair of dummy transfer transistors DF1 and DF2. P-channel field-effect transistors can be used as the dummy load transistors DL1 and DL2, and N-channel field-effect transistors can be used as the dummy drive transistors DD1 and DD2 and the dummy transfer transistors DF1 and DF2.

The dummy drive transistor DD1 and the dummy load transistor DL1 are connected in series with each other to form a dummy CMOS inverter and the dummy drive transistor DD2 and the dummy load transistor DL2 are connected in series with each other to form a dummy CMOS inverter. The outputs and the inputs of a pair of the dummy CMOS inverters are cross-coupled to each other to form a dummy flip-flop.

The connection point of the drain of the dummy drive transistor DD1 and the drain of the dummy load transistor DL1 can form a dummy node D and the connection point of the drain of the dummy drive transistor DD2 and the drain of the dummy load transistor DL2 can form a dummy node DB.

In the main dummy cell 18, the gates of the dummy transfer transistors DF1 and DF2 are connected to the dummy word line DWL. Moreover, in the main dummy cell 18, the dummy node D is connected to the main dummy bit line DBL0 via the dummy transfer transistor DF1. Furthermore, the dummy node DB is connected to a high level potential H via the dummy transfer transistor DF2.

In the auxiliary dummy cells 19, the gates of the dummy transfer transistors DF1 and DF2 are grounded to be connected to a low level potential. Moreover, in the auxiliary dummy cells 19, the dummy nodes D are connected to the auxiliary dummy bit lines DBL1 to DBLn via the dummy transfer transistors DF1, respectively. Furthermore, the dummy node DB is connected to the high level potential H via the dummy transfer transistor DF2.

The dummy node DB of the auxiliary dummy cell 19 does not necessarily be fixed to the high level potential H via the dummy transfer transistor DF2 and can have a configuration similar to the memory cell 12.

The dummy-word-line driving circuit 15 can drive the dummy word line DWL according to the timing at which the bit lines BL and BLB are driven. The timing control circuit 16 can control the timing at which the bit lines BL and BLB and the dummy word line DWL are driven. The inverter 20 can operate the sense amplifier circuit 14 based on the potential of the main dummy bit line DBL0. A sense amplifier enable signal SAE can be output from the inverter 20. The switching control unit 21 can individually set the switching elements SW1 to SWn to an on-state or an off-state.

The number of switching elements to be turned on among the switching elements SW1 to SWn can be set according to the process conditions and the operating conditions. As the process conditions and the operating conditions, for example, an operating voltage and VID of an SRAM are included. VID is information indicating voltage needed for operating an SRAM at a predetermined frequency.

Specifically, when the operating voltage of an SRAM is low (for example, 0.9V), the number of switching elements to be set to an on-state among the switching elements SW1 to SWn is increased to increase the parasitic capacitance added to the main dummy bit line DBL0. When the operating voltage of an SRAM is high (for example, 1.1 V), the number of switching elements to be set to an on-state among the switching elements SW1 to SWn is reduced to reduce the parasitic capacitance added to the main dummy bit line DBL0.

As a method of individually setting the switching elements SW1 to SWn to an on-state or an off-state, fuse elements or a register can be used. When fuse elements are used, switching elements to be set to an on-state can be set to an on-state by blowing the fuse elements corresponding to the switching elements. When a register is used, data indicating which switching elements are set to an on-state is stored in the register, so that the switching elements can be turned on according to the data stored in the register.

Figure 2:
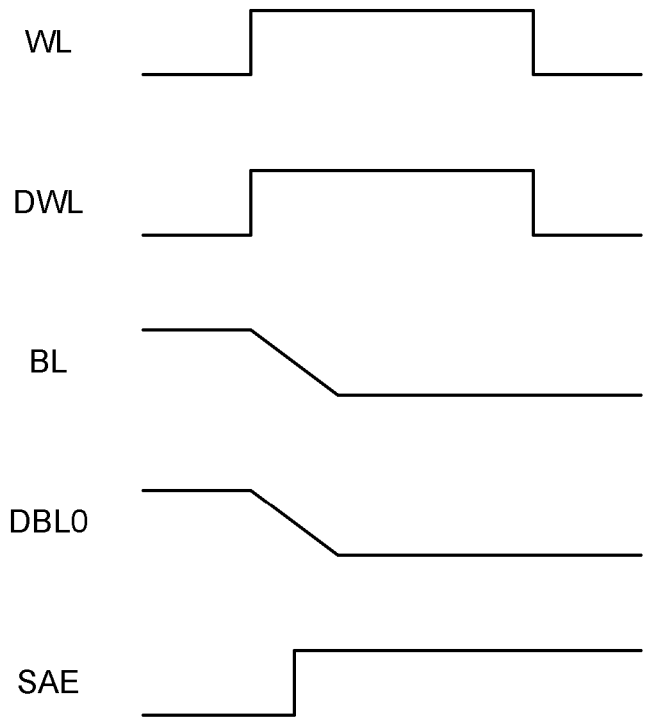
FIG. 2 is a timing chart illustrating a voltage waveform of each unit at the time of reading of the semiconductor storage device in FIG. 1.

FIG. 2 is a timing chart illustrating a voltage waveform of each unit at the time of reading of the semiconductor storage device in FIG. 1.

In FIG. 2, at the time of standby, the bit lines BL and BLB and the main dummy bit line DBL0 are all precharged to a high level. Then, the potential of the main dummy bit line DBL0 is inverted in the inverter 20, so that the sense amplifier enable signal SAE is maintained in a low level and thus the sense amplifier circuit 14 is set to a non-operating state.

Then, at the time of reading, the dummy word line DWL is raised at the timing at which the word line WL selected in row selection by the row decoder 13 rises. In the case where '0' is stored in the storage node N and '1' is stored in the storage node NB, when the word line WL rise, the transfer transistor F1 is turned on, so that a cell current Ic flows in the bit line BL of the selected column. Therefore, the potential of the bit line BL of the selected column gradually decreases.

Moreover, when the dummy word line DWL rises, the dummy transfer transistor DF1 is turned on, so that a dummy current Id flows in the main dummy bit line DBL0. Therefore, the potential of the main dummy bit line DBL0 gradually decreases. The main dummy bit line DBL0 simulates the capacitance of the bit line BL, so that the varying conditions of the potential of the bit line BL can be simulated by the main dummy bit line DBL0.

When the potential of the main dummy bit line DBL0 reaches a threshold of the inverter 20, the sense amplifier enable signal SAE rises and thus the sense amplifier circuit 14 is set to an operating state. Then, in the sense amplifier circuit 14, data stored in the memory cell 12 is detected based on a signal transmitted through the bit line BL and is output as read data RD.

Even when the cell current Ic varies due to variation of the process conditions and the operating conditions, a dummy current Id can follow the variation of the cell current Ic.

Therefore, the operation timing of the sense amplifier circuit 14 can be corrected by generating the sense amplifier enable signal SAE based on the dummy current Id, so that the access time can be shortened while preventing occurrence of a read failure.

The cell current Ic varies in each memory cell 12. Therefore, a margin of the operation timing of the sense amplifier circuit 14 is set according to the width of the distribution of the cell current Ic so that a read failure does not occur even in the memory cell 12 whose cell current Ic is the lowest.

In the worst process conditions or the worst operating conditions, the width of the distribution of the cell current Ic becomes wide, and in the best process conditions or the best operating conditions, the width of the distribution of the cell current Ic becomes narrow. Therefore, in the worst process conditions or the worst operating conditions, the number of switching elements to be set to an on-state among the switching elements SW1 to SWn is increased, so that the margin of the operation timing of the sense amplifier circuit 14 can be widened. In the best process conditions or the best operating conditions, the number of switching elements to be set to an on-state among the switching elements SW1 to SWn is reduced, so that the margin of the operation timing of the sense amplifier circuit 14 can be narrowed.

Consequently, it becomes possible to make the operation timing of the sense amplifier circuit 14 to have a margin according to the process conditions or the operating conditions, so that the margin of the sense amplifier circuit 14 can be prevented from becoming excessive in the best process conditions or the best operating conditions. Thus, the access time can be further shortened while preventing occurrence of a read failure.

Figure 3:
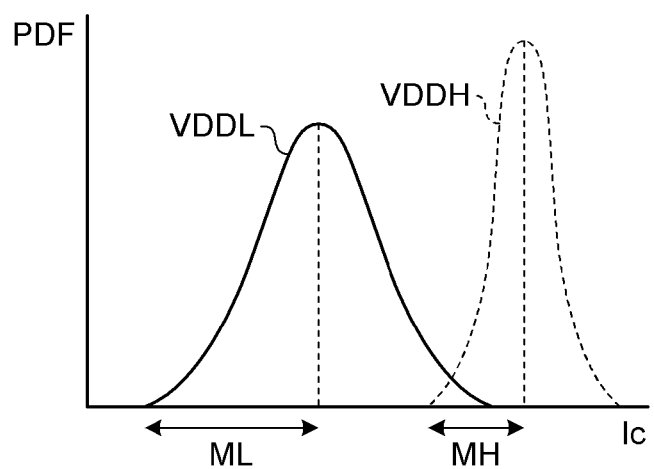
FIG. 3 is a diagram illustrating a relationship between a probability density distribution of a cell current and a margin when operating voltages are different.

FIG. 3 is a diagram illustrating a relationship between a probability density distribution PDF of the cell current and a margin when the operating voltages are different. VDDL indicates the probability density distribution of the cell current Ic when the operating voltage of an SRAM is low and VDDH indicates the probability density distribution of the cell current Ic when the operating voltage of an SRAM is high. This probability density distribution can indicate the number of cells in each cell current Ic.

In FIG. 3, when the operating voltage is low, the cell current Ic decreases and the width of the distribution of the cell current Ic becomes wide. When the operating voltage is high, the cell current Ic increases and the width of the distribution of the cell current Ic becomes narrow. The dummy current Id trances the center value of the cell current Ic.

Therefore, when the operating voltage is low, it is needed to have a margin ML from the center value of the cell current Ic for preventing occurrence of a read failure even in the memory cell 12 whose cell current Ic is the lowest. Moreover, when the operating voltage is high, it is needed to have a margin MH from the center value of the cell current Ic for preventing occurrence of a read failure even in the memory cell 12 whose cell current Ic is the lowest.

When the number of switching elements to be set to an on-state among the switching elements SW1 to SWn is increased, the margin of the operation timing of the sense amplifier circuit 14 can be widened. When the number of switching elements to be set to an on-state among the switching elements SW1 to SWn is reduced, the margin of the operation timing of the sense amplifier circuit 14 can be narrowed.

Therefore, the margin of the operation timing of the sense amplifier circuit 14 can be optimized by changing the number of switching elements to be set to an on-state among the switching elements SW1 to SWn according to the operating voltage. Consequently, when the operating voltage is high, the margin of the operation timing of the sense amplifier circuit 14 can be changed from ML to MH, so that it becomes possible to prevent the margin of the sense amplifier circuit 14 from becoming excessive, enabling to further shorten the access time while preventing occurrence of a read failure.

Second Embodiment

Figure 4:
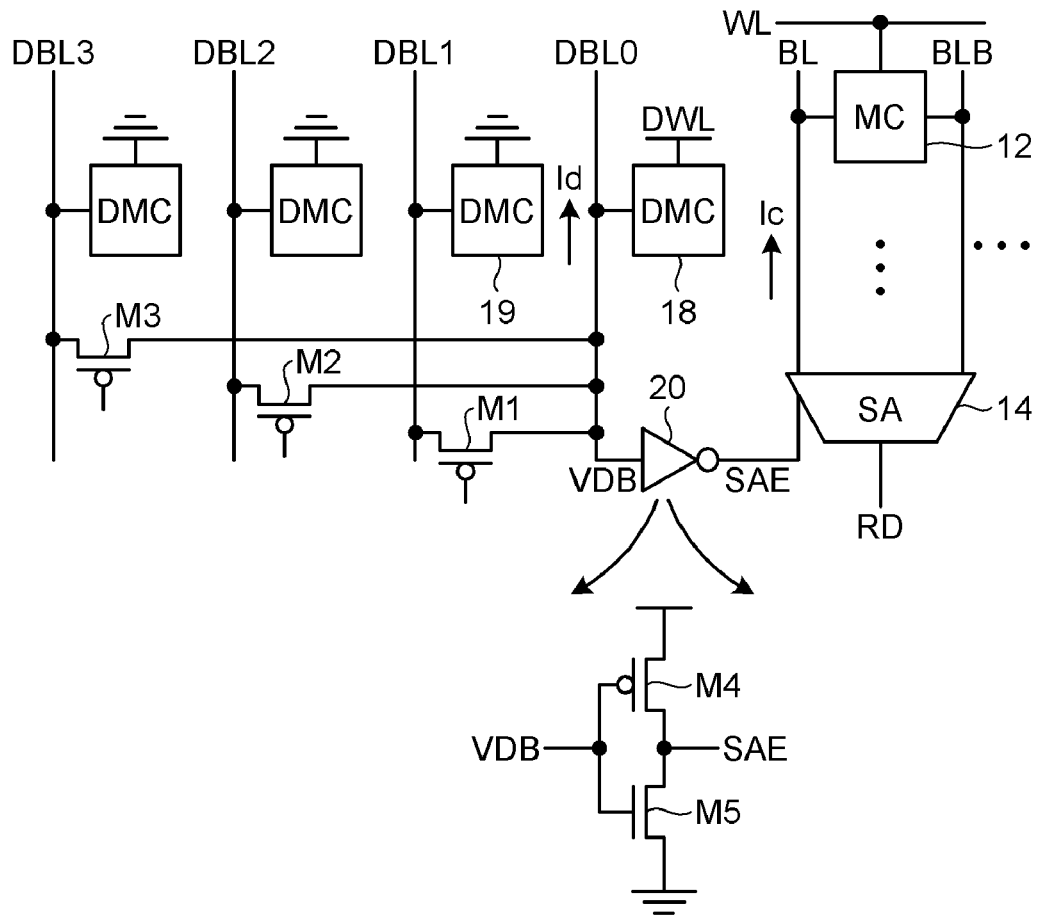
FIG. 4 is a block diagram illustrating a schematic configuration of a semiconductor storage device according to a second embodiment.

FIG. 4 is a block diagram illustrating a schematic configuration of a semiconductor storage device according to the second embodiment.

In FIG. 4, in this semiconductor storage device, n is set to three, so that three auxiliary dummy bit lines DBL1 to DBL3 are provided. Moreover, P-channel field-effect transistors M1 to M3 are provided as the switching elements SW1 to SW3, respectively.

The inverter 20 includes a P-channel field-effect transistor M4 and an N-channel field-effect transistor M5. The gate of the P-channel field-effect transistor M4 and the gate of the N-channel field-effect transistor M5 are connected with each other and the drain of the P-channel field-effect transistor M4 and the drain of the N-channel field-effect transistor M5 are connected with each other. The threshold voltages of the P-channel field-effect transistors M1 to M4 can be set to the same value.

A potential VDB of the main dummy bit line DBL0 is input to the inverter 20 and the sense amplifier enable signal SAE is output from the inverter 20. When the potential VDB of the main dummy bit line DBL0 reaches the threshold voltages of the P-channel field-effect transistors M1 to M4, conduction of the P-channel field-effect transistors M1 to M4 is interrupted.

Figure 5:
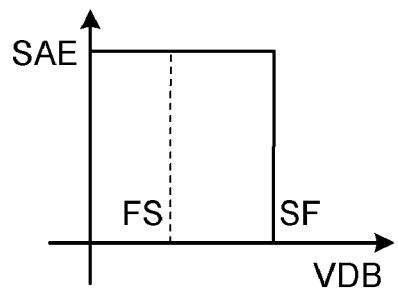
FIG. 5 is a diagram illustrating a relationship between on-regions of P-channel field-effect transistors M1 to M3 and a dummy bit line potential VDB.

FIG. 5 is a diagram illustrating a relationship between on-regions of the P-channel field-effect transistors M1 to M4 and the dummy bit line potential VDB. FS indicates a condition in which the threshold voltages of the P-channel field-effect transistors M1 to M4 become high and SF indicates a condition in which the threshold voltages of the P-channel field-effect transistors M1 to M4 become low.

In FIG. 5, in the FS condition, the logic threshold of the inverter 20 becomes low, so that the timing at which the sense amplifier enable signal SAE rises is delayed. On the other hand, in the FS condition, the threshold voltages of the P-channel field-effect transistors M1 to M3 become high, so that the timing at which the P-channel field-effect transistors M1 to M3 are turned off becomes earlier. Therefore, capacitance added to the main dummy bit line DBL0 becomes light, which shortens the time needed for the potential VDB of the main dummy bit line DBL0 to fall. Thus, delay of the rise timing of the sense amplifier enable signal SAE due to decrease of the logic threshold of the inverter 20 can be reduced, enabling to reduce variation of the operation timing of the sense amplifier circuit 14 in the FS condition.

On the other hand, in the SF condition, the logical threshold of the inverter 20 becomes high, so that the timing at which the sense amplifier enable signal SAE rises becomes earlier. On the other hand, in the SF condition, the threshold voltages of the P-channel field-effect transistors M1 to M3 become low, so that the timing at which the P-channel field-effect transistors M1 to M3 are turned off is delayed. Therefore, capacitance added to the main dummy bit line DBL0 becomes heavy, which lengthens the time needed for the potential VDB of the main dummy bit line DBL0 to fall. Thus, advance of the rise timing of the sense amplifier enable signal SAE due to increase of the logical threshold of the inverter 20 can be reduced, enabling to reduce variation of the operation timing of the sense amplifier circuit 14 in the SF condition.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor storage device comprising:
a memory cell that stores therein data;
a bit line that transmits a signal read out from the memory cell;
a sense amplifier circuit that detects data stored in the memory cell based on a signal transmitted through the bit line;
a write circuit that writes data in the memory cell;
a dummy cell that simulates an operation of the memory cell;
a main dummy bit line that transmits a signal read out from the dummy cell;
an inverter that makes the sense amplifier circuit to operate based on a potential of the main dummy bit line;
n (n is a positive integer) number of auxiliary dummy bit lines; and
a switching element that connects at least one of the n number of auxiliary dummy bit lines to the main dummy bit line.

2. The semiconductor storage device according to claim 1, wherein number of switching elements to be turned on among the switching elements is set according to a process condition or an operating condition.

3. The semiconductor storage device according to claim 2, wherein the number of switching elements to be turned on is set such that a margin, with which a read failure does not occur even in a memory cell whose cell current is the lowest, is ensured.

4. The semiconductor storage device according to claim 2, wherein in a case where an operating voltage of an SRAM is low, the number of switching elements to be turned on is larger than in a case where the operating voltage is high.

5. The semiconductor storage device according to claim 1, wherein the switching element is a transfer gate in which a P-channel field-effect transistor and an N-channel field-effect transistor are connected in parallel with each other.

6. The semiconductor storage device according to claim 1, wherein the switching element is a P-channel field-effect transistor.

7. The semiconductor storage device according to claim 1, further comprising a switching control unit that sets an on-state or an off-state of the switching element individually for each of the auxiliary dummy bit lines.

8. The semiconductor storage device according to claim 7, wherein the switching control unit is a fuse element.

9. The semiconductor storage device according to claim 7, wherein the switching control unit is a register.

10. The semiconductor storage device according to claim 1, wherein the memory cells are arranged in a matrix manner in a row direction and a column direction.

11. The semiconductor storage device according to claim 10, further comprising:
a row decoder that selects the memory cell for each row; and
a word line that transmits a signal that performs row selection of the memory cell.

12. The semiconductor storage device according to claim 11, wherein
the memory cell includes
a first CMOS inverter in which a first drive transistor and a first load transistor are connected in series with each other,
a second CMOS inverter in which a second drive transistor and a second load transistor are connected in series with each other,
a first transfer transistor connected between a first storage node provided at a connection point of the first drive transistor and the first load transistor and a first bit line, and
a second transfer transistor connected between a second storage node provided at a connection point of the second drive transistor and the second load transistor and a second bit line,
output and input of the first CMOS inverter and the second CMOS inverter are cross-coupled to each other, and
a gate of the first transfer transistor and a gate of the second transfer transistor are connected to the word line.

13. The semiconductor storage device according to claim 12, wherein
the dummy cell includes
a first dummy CMOS inverter in which a first dummy drive transistor and a first dummy load transistor are connected in series with each other,
a second dummy CMOS inverter in which a second dummy drive transistor and a second dummy load transistor are connected in series with each other,
a first dummy transfer transistor connected between a first dummy node provided at a connection point of the first dummy drive transistor and the first dummy load transistor and the main dummy bit line, and
a second dummy transfer transistor connected between a second dummy node provided at a connection point of the second dummy drive transistor and the second dummy load transistor and a high level potential,
output and input of the first dummy CMOS inverter and the second dummy CMOS inverter are cross-coupled to each other,
a gate of the first dummy transfer transistor and a gate of the second dummy transfer transistor are connected to a dummy word line, and
the second dummy node is connected to the high level potential.

14. The semiconductor storage device according to claim 13, further comprising a dummy-word-line driving circuit that drives the dummy word line.

15. The semiconductor storage device according to claim 14, further comprising a timing control circuit that controls such that, at a time of reading from the memory cell, the dummy word line rises at a timing at which a word line selected in row selection by the row decoder rises.

16. The semiconductor storage device according to claim 1, wherein configurations of the memory cell and the dummy cell are equivalent to each other.

17. The semiconductor storage device according to claim 1, further comprising an auxiliary dummy cell connected to the auxiliary dummy bit line.

18. The semiconductor storage device according to claim 17, wherein configurations of the auxiliary dummy cell and the dummy cell are equivalent to each other.

19. The semiconductor storage device according to claim 17, wherein the auxiliary dummy cell includes
- a first dummy CMOS inverter in which a first dummy drive transistor and a first dummy load transistor are connected in series with each other,
- a second dummy CMOS inverter in which a second dummy drive transistor and a second dummy load transistor are connected in series with each other,
- a first dummy transfer transistor connected between a first dummy node provided at a connection point of the first dummy drive transistor and the first dummy load transistor and the auxiliary dummy bit line, and
- a second dummy transfer transistor connected to a second dummy node provided at a connection point of the second dummy drive transistor and the second dummy load transistor, output and input of the first dummy CMOS inverter and the second dummy CMOS inverter are cross-coupled to each other, and a gate of the first dummy transfer transistor and a gate of the second dummy transfer transistor are connected to a low level potential.

20. The semiconductor storage device according to claim 1, wherein the inverter includes a P-channel field-effect transistor and an N-channel field-effect transistor, a gate of the P-channel field-effect transistor and a gate of the N-channel field-effect transistor are connected to the main dummy bit line, and a drain of the P-channel field-effect transistor and a drain of the N-channel field-effect transistor are connected with each other and a sense amplifier enable signal is output from the drains.

* * * * *